United States Patent
Tay et al.

(10) Patent No.: US 6,448,664 B1
(45) Date of Patent: Sep. 10, 2002

(54) BALL GRID ARRAY CHIP PACKAGES HAVING IMPROVED TESTING AND STACKING CHARACTERISTICS

(75) Inventors: Wuu Yean Tay; Jeffrey Toh Tuck Fook, both of Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/011,196

(22) Filed: Nov. 13, 2001

Related U.S. Application Data

(62) Division of application No. 09/571,190, filed on May 16, 2000.

(51) Int. Cl.[7] .................. H01L 23/48; H01L 23/52; H01L 29/40
(52) U.S. Cl. .................. 257/780; 257/672; 257/698; 257/737; 257/48; 438/18; 438/613
(58) Field of Search ................... 257/780, 672, 257/673, 676, 692, 698, 737, 738, 787, 48; 438/17, 18, 613, 625

(56) References Cited

U.S. PATENT DOCUMENTS

| | | |
|---|---|---|
| 4,992,849 A | 2/1991 | Corbett et al. |
| 5,151,651 A | 9/1992 | Shibata |
| 5,227,717 A | 7/1993 | Tsurishima et al. |
| 5,239,198 A | 8/1993 | Lin et al. |
| 5,258,648 A | 11/1993 | Lin |
| 5,334,857 A * | 8/1994 | Mennitt et al. ............. 257/48 |
| 5,378,981 A * | 1/1995 | Higgins, III ............. 324/158.1 |
| 5,483,024 A | 1/1996 | Russell et al. |
| 5,506,499 A * | 4/1996 | Puar ...................... 29/847 |
| 5,625,221 A | 4/1997 | Kim et al. |
| 5,668,405 A | 9/1997 | Yamashita |
| 5,677,566 A | 10/1997 | King et al. |
| 5,721,496 A | 2/1998 | Farnworth et al. |
| 5,731,709 A | 3/1998 | Pastore et al. |
| 5,786,271 A | 7/1998 | Ohida et al. |
| 5,789,271 A * | 8/1998 | Akram ...................... 438/18 |
| 5,789,278 A | 8/1998 | Akram et al. |
| 5,815,000 A | 9/1998 | Farnworth et al. |
| 5,815,372 A | 9/1998 | Gallas |
| 5,831,444 A | 11/1998 | Pai |
| 5,844,315 A | 12/1998 | Melton et al. |
| 5,859,538 A | 1/1999 | Self |
| 5,872,458 A | 2/1999 | Boardman et al. |
| 5,883,426 A | 3/1999 | Tokuno et al. |
| 5,973,403 A | 10/1999 | Wark |
| 5,977,784 A | 11/1999 | Pai |
| 5,994,166 A | 11/1999 | Akram et al. |
| 6,018,249 A | 1/2000 | Akram et al. |
| 6,025,725 A | 2/2000 | Hembree et al. |
| 6,049,129 A * | 4/2000 | Yew et al. .................. 257/737 |
| 6,127,833 A * | 10/2000 | Wu et al. .................. 324/754 |
| 6,249,052 B1 * | 6/2001 | Lin ......................... 257/734 |
| 6,335,565 B1 | 1/2002 | Miyamoto et al. |

* cited by examiner

*Primary Examiner*—Lincoln Donovan
*Assistant Examiner*—Kyung S. Lee
(74) *Attorney, Agent, or Firm*—TraskBritt

(57) ABSTRACT

A stackable ball grid array (BGA) or fine ball grid array (FBGA) semiconductor package particularly suitable for board-on-chip or chip-on-board applications in which a low profile BGA or FBGA semiconductor package is needed. The stackable ball grid array (BGA) or fine ball grid array (FBGA) provides a semiconductor package that is capable of being burned in and tested in a more efficient and cost effective manner than prior known BGA or FBGA semiconductor packages. A high density, low profile memory module incorporating a plurality of the disclosed BGA or FBGA semiconductor packages in a stacked arrangement is further disclosed.

24 Claims, 11 Drawing Sheets

BALL GRID ARRAY CHIP PACKAGES HAVING IMPROVED TESTING AND STACKING CHARACTERISTICS

CROSS-REFERENCE TO RELATED APPLICATION

This application is a divisional of application Ser. No. 09/571,190, filed May 16, 2000, pending.

BACKGROUND OF THE INVENTION

Field of the Invention: The present invention generally relates to board-on-chip and chip-on-board ball grid array, including fine ball grid array, semiconductor chip packages. The present invention more particularly relates to constructing ball grid array semiconductor chip packages that are particularly suitable for being burned in and tested in a more efficient and cost effective manner. The subject invention further provides stackable ball grid array semiconductor chip packages which may be used to form highly dense, low profile microelectronic components in which the semiconductor chip, or device, is better protected.

State of the Art: Ball grid array (BGA), including fine ball grid array (FBGA), semiconductor device packages are well known in the art. For convenience, a representative prior art BGA package is shown in drawing FIGS. 1 through 3. BGA chip packages, such as exemplary chip package 10, often comprise a substrate 12, such as a printed circuit board, having an elongated aperture 14 extending through the middle thereof. A semiconductor die 16, such as a dynamic random access memory (DRAM) device for example, is mounted on the opposite or bottom side of the substrate which is not viewable in drawing FIG. 1. Semiconductor die or device 16 most often will have a plurality of bond pads 20 in single or multiple columns on an active surface 18 of semiconductor die 16. The active surface 18 of die 16 is shown facing upward and can be viewed through aperture 14 in drawing FIG. 1. Substrate 12 is provided with an upward facing top surface 22, as shown in drawing FIG. 1, having a plurality of contact or bond pads 24 located along the periphery of aperture 14. Circuit traces 26 located on or within substrate 12 serve to electrically connect bond pads 20 to respective electrically conductive, connective elements such as solder balls 28. The electrically conductive elements typically comprise solder balls in electrical communication with and attached to a contact pad (not shown in FIGS. 1–3), or can merely be a solder ball placed directly upon, or in electrical communication with, the termination point of a selected circuit trace 26. Gold filled or other conductive metal-based solder balls are frequently used. Alternatively, conductive balls made of a conductive-filled epoxy material having specifically preselected conductive qualities are also frequently used. The conductive elements or balls are arranged in a grid array pattern wherein the conductive elements or solder balls 28 are of a preselected size or sizes and are spaced from each other at one or more preselected distances, or pitches. Hence, the term fine ball grid array (FBGA) merely refers to a particular ball grid array pattern having what are considered to be relatively small conductive elements or solder balls 28 being spaced at very small distances from each other resulting in dimensionally small spacings or pitch. As generally used herein, the term ball grid array (BGA) encompasses fine ball grid arrays (FBGA) as well as ball grid arrays. Typical solder ball sizes can be approximately 0.6 mm or less and the solder balls may have a spacing or pitch of approximately 0.80 mm or less. However, the present invention is not limited with respect to a particular solder ball diameter or pitch.

Contact or bond pads 20 on active surface 18 of die 16 are electrically, and to an extent mechanically, attached to respective contact pads 24 located on surface 18 of substrate 12 by way of respective bond wires 30 by wire bonding methods known and practiced within the art.

Referring now to drawing FIGS. 2 and 3, which are cross-sectional views taken along line 2/3—2/3 as shown in drawing FIG. 1, bottom side or surface 32 of substrate 12 and nonactive side 36 of die 16 are denoted. Semiconductor die or device 16 is attached to bottom side 32 of substrate 12 by any suitable adhesive 34. Illustrated in drawing FIG. 3 is an encapsulant 38 disposed over contact pads 24, bond wires 30, and bond pads 20 so as to protect and secure the somewhat fragile bond wires and bond sites from environmentally induced corrosion or other physical harm during immediately subsequent processing, storage, shipment, further processing, and ultimately during end use.

For quality control purposes, as well as manufacturing efficiency, it is standard practice to burn-in and electrically test semiconductor chip packages, such as representative prior art chip element 10, prior to installing the packages on the next higher level of assembly, such as upon a dual in-line memory module (DIMM). Those chip packages that do not successfully undergo burn-in and testing are either reworked and retested or are scrapped in accordance with economic feasibilities of the particular chip package being manufactured. In order to perform such pre-installation burn-in and testing, that is, intentionally subjecting the packages to elevated voltages and temperatures and then running preliminary, and perhaps diagnostic, tests on BGA chip packages such as BGA chip package 10, the chip packages must be mounted in specifically designed test tooling. A simplified illustration of representative test tooling 40 is shown in drawing FIG. 4. Generally, each BGA package 10 is placed in chip receiving cell 44 of tray or holder 42. Chip 10 usually has, but may not have, encapsulant 38 disposed thereon at the time of burn-in and testing. Upon chip 10 being properly seated in tray 42, probe head 46 is moved toward package 10 in the direction of the arrow so as to engage each probe 48 with a corresponding conductive element such as solder ball 28. Upon BGA chip package 10 being burned-in and tested, probe head 46 is withdrawn from the chip package and the chip package is removed from test tray or holder 42 and forwarded on for further processing depending on the test results.

Because there are typically a large number of such solder balls to be contacted by a like number of probes for each chip package which must be arranged in a precise array or pattern in order to make electrical contact with the underlying solder balls, the test tooling is quite expensive, as well as time consuming, to construct. The time and expense factors of providing specific test tooling for each type of BGA chip having a wide variety of ball grid array patterns is compounded when the particular BGA chips to be burned-in and tested are of the fine ball grid array variety wherein the balls and spacing are quite small, thereby making the construction of the chip package test tooling even more time consuming and expensive. Furthermore, the specific test tooling to be devised must not only accommodate, burn-in, and test a single chip package, but must also be able to simultaneously accommodate, burn-in, and test a significant number of other chip packages, which may or may not have been segmented from a common substrate and are usually positioned and accompanied by respective cells of test tooling so that production quantities can be produced economically. Thus, it can be appreciated that the time and expense of constructing BGA chip package test tooling, that by necessity has a multiplicity of probes specifically sized and arranged in patterns which must exactly correspond to the respective solder ball array being tested, is a significant hindrance to quickly introducing BGA chip packages and, in particular, FBGA chip packages having new and different solder ball array patterns, to the very competitive semiconductor chip marketplace. Furthermore, the test probes of the test tooling must be designed not to unduly damage the solder balls which will ultimately be used to electrically and mechanically connect the chip package to the next level of assembly by solder ball attachment methods used within the art.

U.S. Pat. No. 5,977,784, issued to Pai on Nov. 2, 1999 and related U.S. Pat. No. 5,831,444, issued to Pai on Nov. 3, 1998, are directed toward a method and apparatus for testing BGA chip packages wherein chip packages are placed within a self-centering test housing wherein contacts of the chip package are brought into contact with respective matching contact pads in order to burn-in and test the chip package. However, the testing apparatus of Pai must be provided with matching test contacts having the same array or pattern of the contact pads of the chip package to be tested in order to properly test the chip package. Thus the substrate in which the test pads are located must be specifically manufactured to match the specific grid array of the chip package to be tested giving rise to previously discussed unwanted new product lead times and expenses.

U.S. Pat. No. 6,018,249 issued to Akram et al. on Jan. 25, 2000, and assigned to the assignee of the present invention, provides a further example of a testing system for the testing of chip packages having external contacts or bumps arranged in a BGA or FBGA pattern. Notwithstanding the desirable features of the Akram et al. patent, the disclosed testing system includes matching contacts being provided and suitably positioned for respectively connecting with a correspondingly positioned external contact or bump on the chip package to be tested.

U.S. Pat. No. 5,677,566 issued to King et al. on Oct. 14, 1997, and assigned to the assignee of the present invention, is directed toward overcoming a problem in the industry wherein bare chips are continuously made increasingly smaller yet the chip molded plastic resin encapsulated package-to-external circuit electrical connection typically remains at a previous, industry-set size and configuration when chips were larger. The semiconductor chip package taught by the King et al. U.S. Pat. No. 5,677,566 patent is provided with a lead frame having leads that generally originate near the center of the package and extend generally laterally outwardly over the chip toward and, if desired, beyond the periphery of the encapsulating material which generally defines the chip package. The innermost region of each conductive lead is wire bonded to a respective bond pad located on the active surface of the chip. The conductive leads near the periphery of the chip are exposed for accommodating a solder ball or other conductive element on the upper surface of the package which is ultimately to be mounted on a printed circuit board in accordance with previous industry standards. The laterally protruding outer end portions of the individual conductive leads facilitate testing of the chip as the ends can be contacted with presently used testing equipment. After testing, the protruding ends can be trimmed flush with the exterior of the plastic resin package. Alternatively, the laterally protruding outer end portions of the conductive leads may be trimmed prior to encapsulating the entire chip package with plastic resin. Although suitable for many applications, providing the separate lead frame and fully encapsulating the chip package of King et al. may unnecessarily add to the complexity and cost of manufacturing chips to be used in other applications.

U.S. Pat. No. 5,731,709, issued to Pastore et al. on Mar. 24, 1998, discloses a ball grid array semiconductor device and apparatus for testing the device. In particular, Pastore et al. discloses a chip mounted on the top surface of a substrate which has a plurality of conductive castellations positioned around the periphery of the substrate serving as redundant electrical connections that are in communication with respective bond pads on the semiconductor die. The conductive castellations, which are disclosed as being conductive vias that have been formed in the substrate which is subsequently trimmed to define the periphery of the substrate, thereby cutting the conductive vias in half, are engaged by specifically designed test apparatus to avoid directly contacting solder balls located on the top surface of the substate. The test apparatus includes a test socket designed to accommodate the semiconductor device having contact members to make contact with the conductive castellations located about the periphery. The disclosed test apparatus appears to have been specifically designed to accommodate the disclosed semiconductor device. Thus, it would appear that added monetary costs would be incurred upon constructing and incorporating such test apparatus, or at least the disclosed test socket, into a production line.

In addition to the semiconductor packaging industry being driven to increase the number of solder balls or conductive contacts that are to be included within a BGA chip package of a given surface area, the industry is also being driven to reduce the overall height or profile of packaged semiconductor chips so that components and modules incorporating such chips can be made yet smaller and more compact. Thus, the industry is seeking ways in which BGA chip packages can be constructed so as to further reduce their individual height. Furthermore, the industry is seeking ways in which BGA chip packages may be stacked one upon another which are, in turn, attached to a substrate or board to provide modules, such as dual in-line memory modules, of ever slimmer profiles.

An example of a lead chip design in a BGA package is shown in U.S. Pat. No. 5,668,405, issued to Yamashita on Sep. 16, 1997. The Yamashita patent discloses a semiconductor device that has a lead frame attached to the semiconductor chip. Through-holes are provided in a base film that allows solder bumps to connect via the lead frame to the semiconductor device. The Yamashita patent requires several steps of attaching the semiconductor device to the lead frame, then providing sealing resin, and then adding a base film and forming through-holes in the base film. A cover resin is added before solder bumps are added in the through-holes to connect to the lead frame. Thus, the resulting structure lacks the ability to stack devices one on top of another and further requires special test tooling be provided to match the particular grid pattern of the solder bumps.

U.S. Pat. No. 5,677,566, issued to King et al. on Oct. 14, 1997, referenced earlier herein, discloses a semiconductor chip package that includes discrete conductive leads with electrical contact bond pads on a semiconductor chip. The lead assembly is encapsulated with a typical encapsulating material and the solder balls or conductive elements are formed to protrude through the encapsulating material to contact the conductive leads and make contact with an external circuit. Although the semiconductor chip has the leads wire bonded to bond pads located in the center of the die thereby allowing the conductive leads to be more readily protected upon being encapsulated by the encapsulating material, the chip package construction of the King et al. patent lacks the ability to be stacked one upon another.

With respect to stacking semiconductor chip packages, there are various methods of stacking semiconductor devices in three-dimensional integrated circuit packages known within the art. One such design is disclosed in U.S. Pat. No. 5,625,221, issued to Kim et al. on Apr. 29, 1997. The Kim et al. patent discloses a semiconductor package assembly that has recessed edge portions which extend along at least one edge portion of the assembly. An upper surface lead is exposed therefrom and a top recess portion is disposed on a top surface of the assembly. A bottom recess portion is disposed on the bottom surface of the assembly, such that when the assembly is used in fabricating a stacked integrated circuit module, the recess edge portion accommodates leads belonging to an upper semiconductor assembly to provide electrical interconnection therebetween. Unfortunately, the assembly requires long lead wires from the semiconductor chip to the outer edges. These lead wires add harmful inductance and unnecessary signal delay and can form a weak link in the electrical interconnection between the semiconductor device and the outer edges. Further, the device profile is a sum of the height of the semiconductor die, the printed circuit board to which it is bonded, the conductive elements, such as the solder balls, and the encapsulant that must cover the die and any wire bonds used to connect the die to the printed circuit board. So, reducing the overall profile is difficult because of the geometries required in having the lead pads on the semiconductor chip along the outer periphery with extended lead wires reaching from the chip to the outer edges.

It can be appreciated that one of the favorable attributes of BGA chip packages is that the total height or overall thickness of the chip package is quite thin compared to other chip packages. Thus, BGA chip packages lend themselves to be especially suitable for incorporation within memory modules such as SDRM modules and, in particular, dual in-line memory modules (DIMM).

Accordingly, what is needed within the art is a ball grid array chip package that can be easily burned-in and tested by existing test tooling. Another need within the art is for low-profile ball grid array chip packages that can be stacked so as to have a minimum amount of stack height to allow the production of low-profile dual in-line memory modules, for example. Such low-profile stackable packages would ideally have a lower profile than otherwise provided in the prior art and would ideally be producible with as few production steps as is feasible, yet provide adequate protection of the semiconductor chip during shipping and handling.

BRIEF SUMMARY OF THE INVENTION

According to the present invention, a stackable ball grid array (BGA) or fine ball grid array (FBGA) semiconductor package is disclosed which is particularly suitable for board-on-chip or chip-on-board applications in which low-profile BGA or FBGA semiconductor packages are needed due to space limitations. Such an exemplary need includes, but is not limited to, memory modules used in notebook sized personal computers, for example.

BGA or FBGA semiconductor packages of the present invention generally comprise a substrate having a semiconductor device attached to a selected surface thereof. The semiconductor device has a plurality of bond pads respectively wire bonded to a plurality of bond pads located on the substrate. Preferably, the wire bonds extend through an aperture extending through the substrate. The substrate is further provided with a plurality of circuit traces leading from the substrate bond pads to a plurality of connective elements, such as solder ball contact pads and associated solder balls, which are arranged in a preselected ball grid array pattern. Additional or continuations of the same circuit traces further extend to a plurality of test pads arranged and located on the substrate in a preselected pattern. Preferably, at least the interconnecting circuit traces electrically connecting selected substrate bond pads to intermediately positioned connective elements, preferably including solder ball contact pads and associated solder balls, and, in turn, electrically connecting respective test pads, are preformed on a tape which can be conveniently and efficiently attached to one or more surfaces of the substrate. Burn-in and testing of the semiconductor chip attached to the substrate is preferably performed by prior existing test tooling having test probes arranged in patterns typically used in prior known semiconductor chip packages to contact the test pads of the semiconductor chip packages of the present invention. Upon the test pads being contacted by the test probes of the test tooling, selected voltages can be applied to selected pads to burn-in and test the semiconductor device attached to the substrate. This feature is a significant improvement over prior known methods of using test probes specifically designed and arranged in the same specific ball grid array pattern that the individual connective elements or solder balls of prior known ball grid array semiconductor packages are arranged.

Preferably, BGA/FBGA semiconductor packages embodying the present invention are provided a plurality of test pads which are arranged in a thin small outline package (TSOP) pin-out pattern because test tooling used for burning-in and testing prior known non-BGA/FBGA semiconductor packages is widely available within the industry. In addition to alleviating the time and expense required to design and construct test tooling specifically designed to contact the connective elements of a BGA semiconductor package arranged in a particular ball grid array, there is no need to contact and perhaps damage the individual connective elements or solder balls.

Upon successfully burning-in and testing a BGA/FBGA semiconductor package constructed in accordance with the present invention, the test pads may be disassociated from the substrate to decrease the final surface area; or foot print of the semiconductor package, if so desired.

Further in accordance with the present invention, the semiconductor device and the connective elements may optionally be provided on the same surface of the substrate of the BGA/FBGA semiconductor package so as to decrease the profile of the semiconductor package. This is particularly useful when stacking and attaching a plurality of BGA/FBGA semiconductor packages on a common board used in a memory module, such as a dual in-line memory module.

These and additional features and benefits of the present invention are further described and illustrated in the following detailed description of the invention and the present drawings.

DETAILED DESCRIPTION OF THE INVENTION

Figure 5:
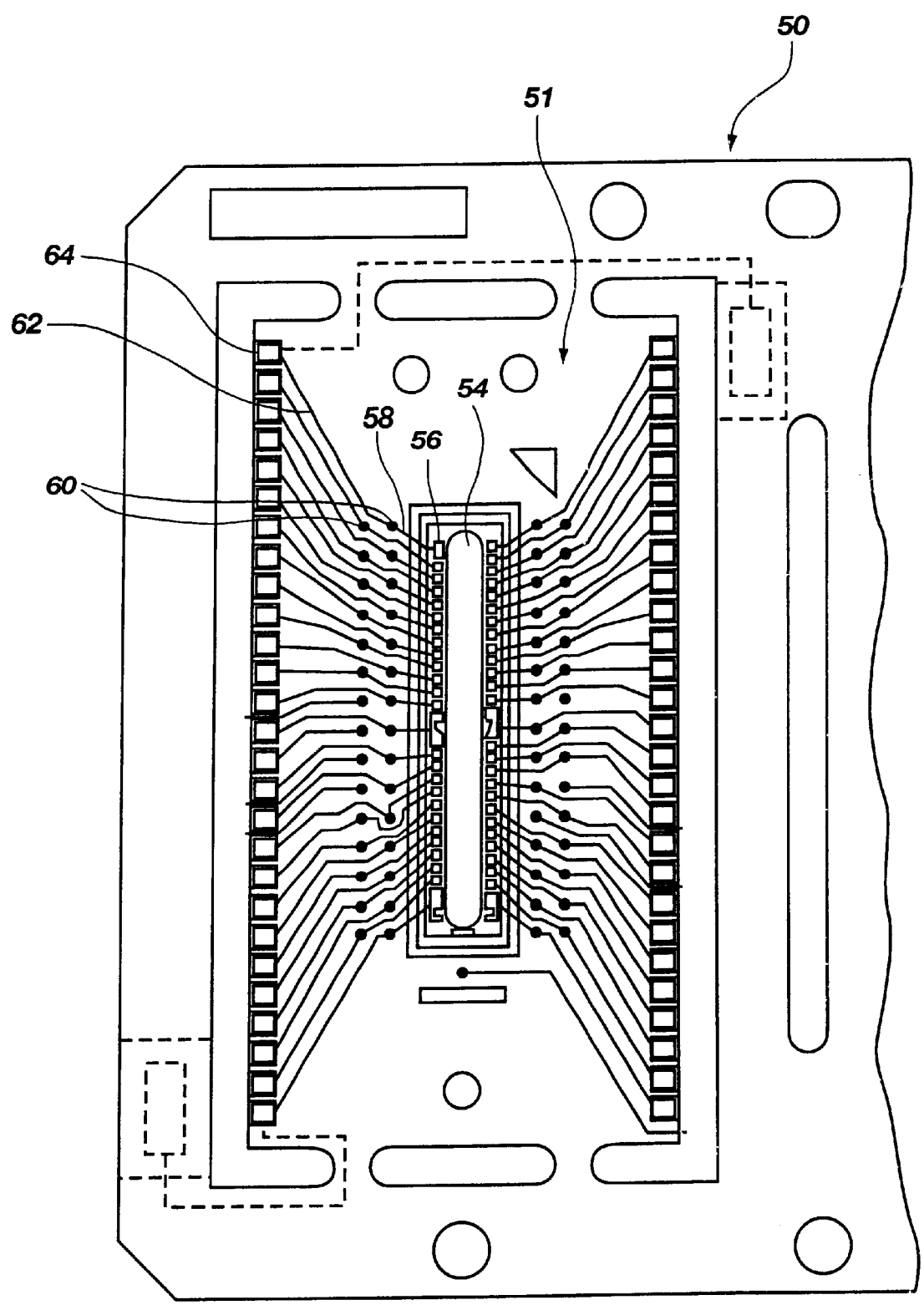
FIG. 5 is a top view of an exemplary 60 ball grid array substrate/tape outline for forming a ball grid array package having circuit traces fanning out to provide peripherally located test pads corresponding to a thin small outline package in accordance with the present invention.
Figure 6:
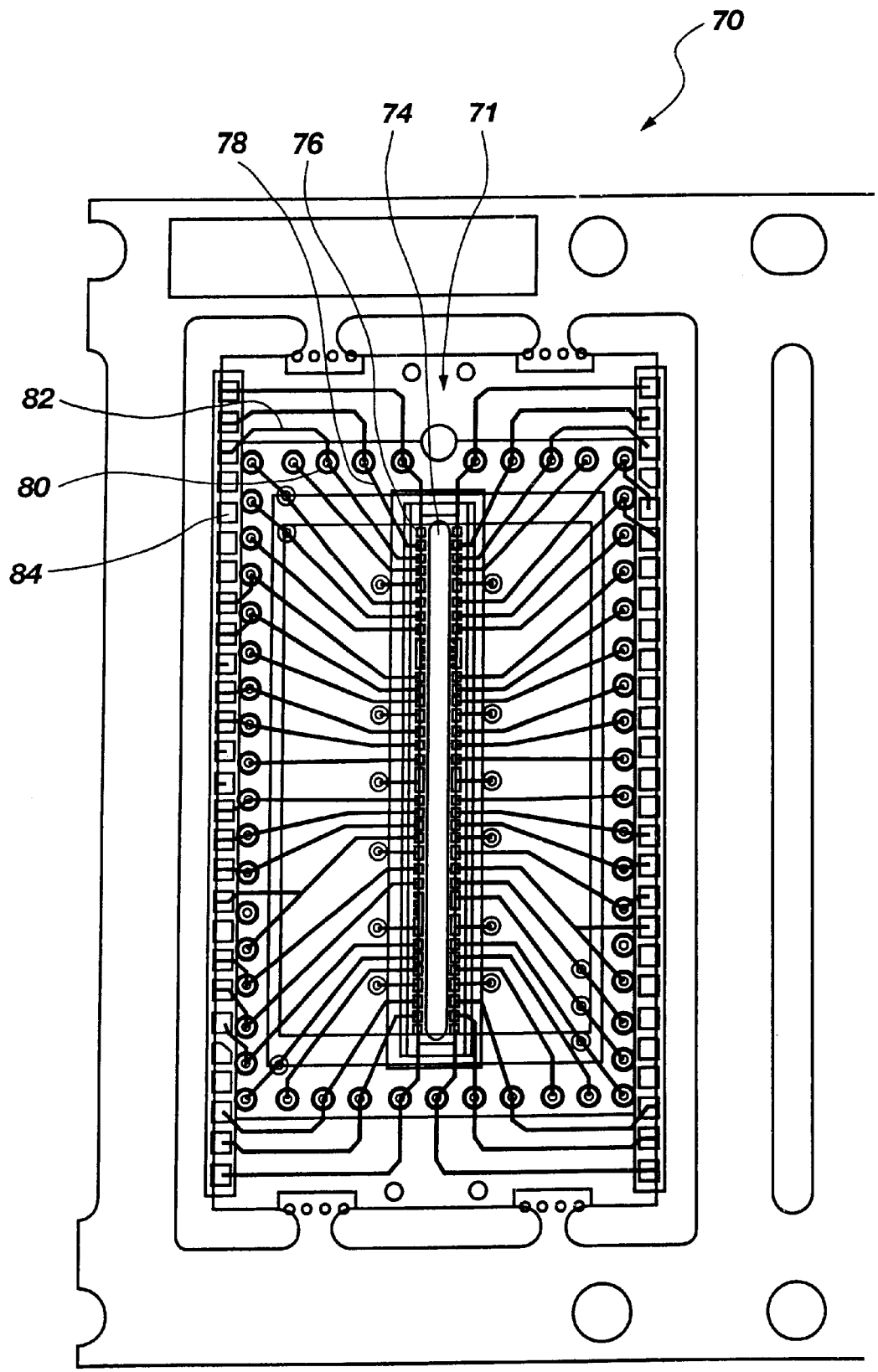
FIG. 6 is a top view of an exemplary 54 ball grid array substrate/tape outline for forming a ball grid array package having circuit traces fanning out to provide peripherally located test pads corresponding to a thin small outline package in accordance with the present invention.

Referring now to FIGS. 5 and 6 of the drawings, isolated top views of exemplary substrate tape having electrical circuit outlines preformed therein and which are to be applied to one or more exposed faces of a supporting substrate are illustrated. Tapes 50 and 70 shown in drawing FIGS. 5 and 6, respectively, provide a convenient and efficient method of providing circuitry on a supporting substrate in which a chip will ultimately be attached and electrically connected therewith. Each individual chip circuitry portion 51 and 71 are preferably designed to accommodate one chip. Thus, there are multiple, identically repeating individual die portions on a given tape. Such tapes frequently include a thermosetting adhesive which will bond to a wide variety of substrates. The supporting or core substrate may be made from a wide variety of materials with epoxy-glass material such as, but not limited to, bismaleimide-triazin (BT) or FR-4 board which are both heavily favored by the industry. Alternative substrate materials include ceramic or silicon materials.

Individual chip circuitry portions 51 and 71 of tapes 50 and 70 are respectively attached to one or both sides of a complementary configured supporting substrate which, in turn, will accommodate at least one bare chip. Such exemplary substrates, denoted as 52 and 72, respectively, may be seen in cross-section in drawing FIGS. 8B and 9B wherein individual chip circuitry portion 51 of tape 50 has been applied on top of substrate 52 and individual chip circuitry portion 71 of tape 70 has been applied on top of substrate 72.

Referring to drawing FIG. 5, tape 50 includes an aperture 54 having bond pads 56 located along opposing sides of the aperture. Bond pads 56 are selectively provided with an electrically conductive trace 58 that leads to a respective conductive element, solder ball, or solder ball location 60. Selected conductive elements or solder balls 60, are provided with a second circuit trace 62 leading to a respective test contact pad 64 located outwardly away from aperture 54 and solder balls 60. Test pads 64 are preferably arranged to fan out in what is referred to as a thin small outline package (TSOP) which is recognized as an industry standard.

As can be seen in drawing FIG. 5, individual chip circuitry portion 51 includes various circuit traces 58 and 62 which interconnect bond pads 56 to solder balls 60 and which further interconnect solder balls 60 to peripherally located test contact pads 64. Circuit traces 58 and 62 are able to be easily routed around any solder balls 60 in a somewhat serpentine fashion to circumvent one or more particular solder balls that would otherwise physically block the circuit from reaching its respective destination. This particular characteristic of being able to route circuit traces as needed around intervening solder balls 60, or alternative connective elements used in connection with or in lieu of solder balls, allows great versatility in that solder ball grid arrays having virtually any feasible number of solder balls arranged in any feasible pattern could be used and need not be restricted to the exemplary 4 column arrangement as shown in drawing FIG. 5. It should be appreciated that although substrate tape outline 50 provides a convenient, cost-efficient method of providing the desired circuit traces and ball grid array on a selected substrate, alternative methods to apply circuit traces to a substrate can be used. For example, circuit layers including circuit traces, bond pads, solder balls, or contact elements, and/or test contact pads could be screen printed onto one or both faces of a substrate. Furthermore, multiple layers of circuit layers can be disposed upon not only the exposed surfaces of the supporting substrate, but circuit layers could be "sandwiched" or laminated within the substrate by circuit layer lamination methods known in the art if so desired.

Another exemplary substrate tape outline 70 showing an individual chip circuitry portion 71 having a preselected ball grid array arrangement is shown in drawing FIG. 6 of the drawings. In drawing FIG. 6, individual chip circuitry portion 71 includes a 54 ball grid array which has been laid out so as to place solder balls and/or connective elements 80 about the periphery of what is to be the chip-scaled package with test contact pads 84 being further outwardly positioned opposite each other along two sides of what will be a chip package. As with test contact pads 64 of the tape outline shown in drawing FIG. 5, test contact pads 84 in drawing FIG. 6 have been prearranged to coincide with a thin small outline package pin-out configuration. Bond pads 76 located along aperture 74 are placed in electrical communication with selected respective solder balls and/or connective elements 80 by circuit traces 78. In turn, selected solder balls 80 are placed in electrical communication with test contact pads 84 through second circuit traces 82 so as to provide a continuous conductive path from a selected test contact pad 84 back to at least one selected bond pad 76.

Figure 1:
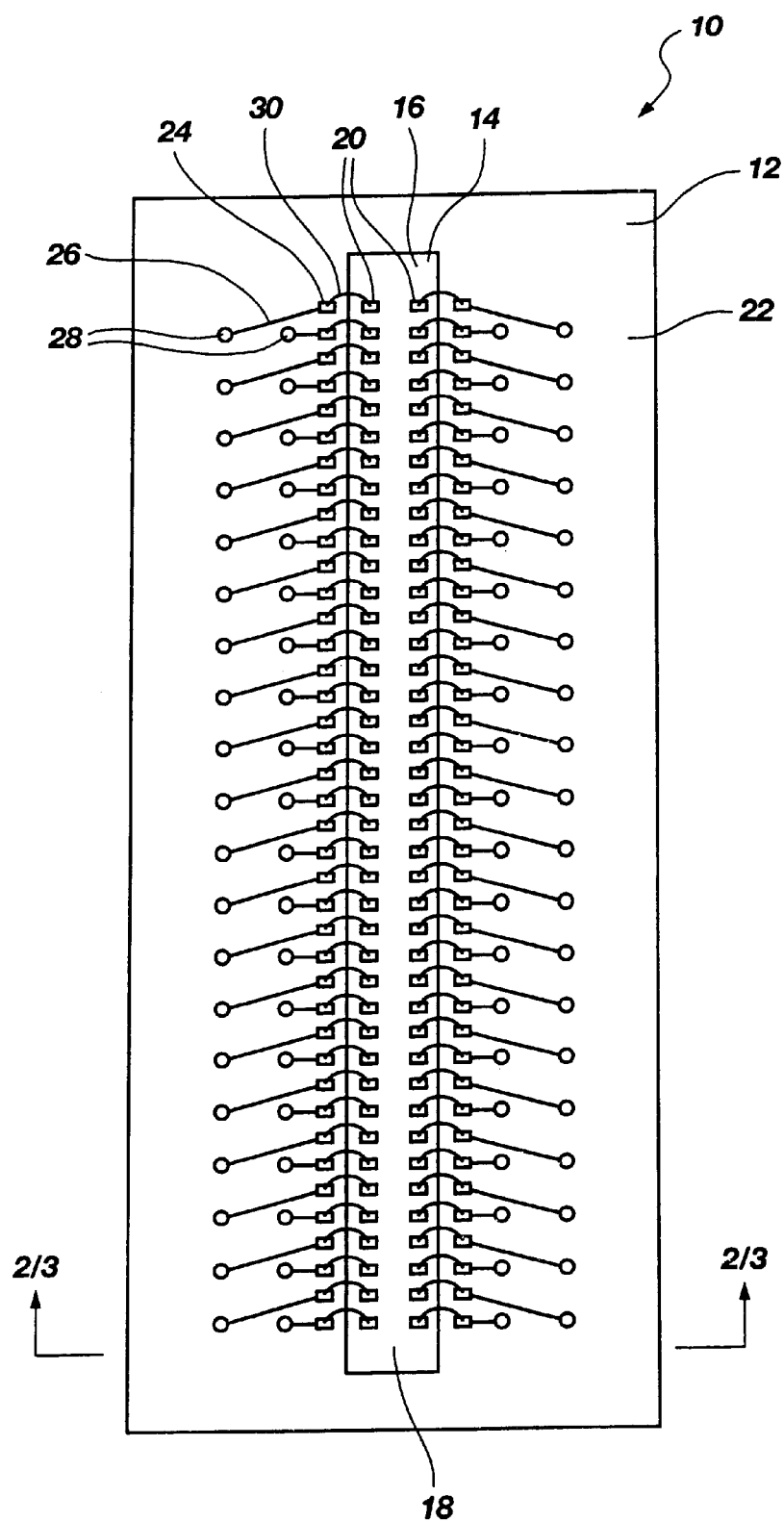
FIG. 1 is a top view of a representative prior art ball grid array chip package.
Figure 2:
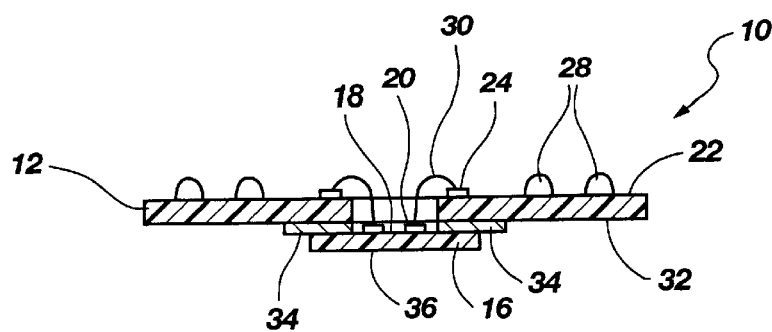
FIG. 2 is a cross-sectional view of the ball grid array chip package shown in FIG. 1 as taken along section line 2/3—2/3.
Figure 3:
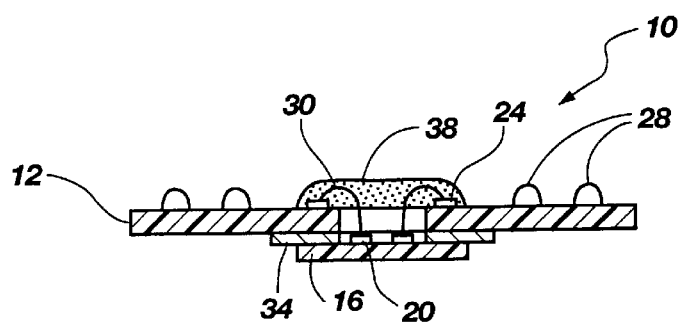
FIG. 3 is a cross-sectional view of the ball grid array chip package shown in FIG. 1 as taken along section line 2/3—2/3 with encapsulant being disposed over the bond pads located on the active surface of the underlying chip, the bond pads of the substrate, and the interconnecting bond wires.
Figure 4:
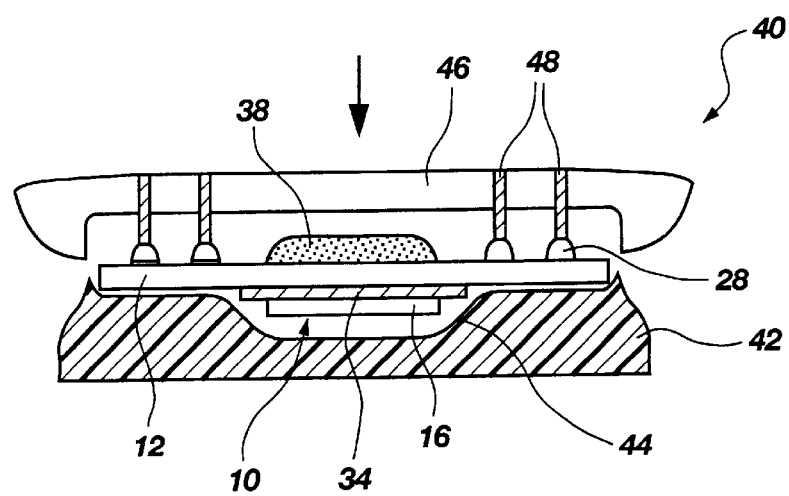
FIG. 4 is a simplified, cross-sectional illustration of the representative ball grid array chip package shown in FIGS. 1–3 as installed in burn-in and test tooling specifically constructed to have respective contact probes arranged in a pattern that corresponds to each solder ball of the particular ball grid array pattern of the chip package being tested.
Figure 7A:
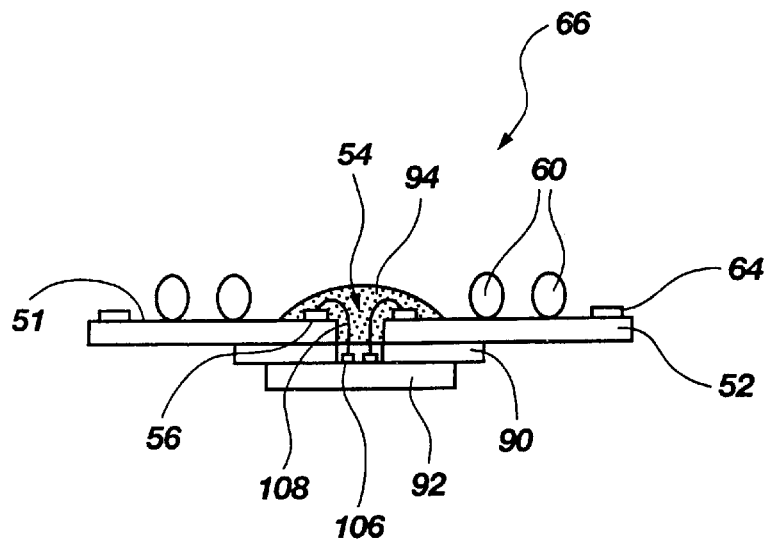
FIG. 7A is a cross-sectional view of a representative ball grid array chip package incorporating the exemplary substrate tape outline of FIG. 5 prior to the chip package being burned-in and tested.
Figure 7B:
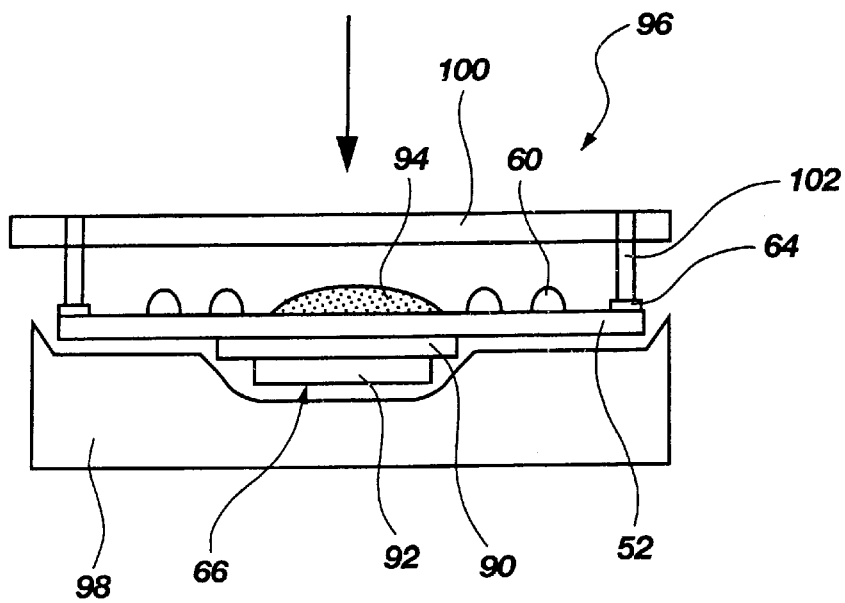
FIG. 7B is a simplified, cross-sectional illustration of the representative grid array chip package of FIG. 7A being installed and undergoing burn-in and testing in standard test tooling having test probes arranged to engage test contact pads laid out in a standard thin small outline package pattern in accordance with the present invention.

Collectively referring to drawing FIGS. 7A through 9B, as well as drawing FIGS. 1 through 3, an exemplary BGA chip package constructed in accordance with the present invention is shown in cross-section in drawing FIG. 7A. The process of attaching at least one semiconductor die 92 to the bottom side of a substrate 52 in which an individual chip circuitry portion 51 of tape 50 has been applied to at least the opposite or top side of substrate 52, is carried out much like, if not identical to, prior known methods such as those discussed here with respect to the chip package illustrated in drawing FIGS. 1 through 3. That is, a bare semiconductor chip or device 92 is attached to substrate 52 by way of a die attach adhesive 90. Adhesive 90 is preferably a dielectric adhesive that is nonconductive and has a coefficient of thermal expansion (COTE) that is compatible with semiconductor die 92. Adhesive 90 may be formed of epoxy resin, polymer adhesives, or any other adhesive having suitable properties. Alternatively, tape having adhesive applied to both sides, such as Kapton™ tape, is particularly suitable for use as adhesive or die attach pad 90. Upon die 92 being located and attached to substrate 52 so as to properly orient and align bond pads 56 which are located on the active surface of die 92 to face upward within aperture 54 of substrate 52, bond wires 108 are provided which respectively place a selected chip bond pad 106 in electrical communication with a respectively appropriate bond pad 56 located on the opposite or upper surface of substrate 52. A top view of aperture 54, die bond pads 106 located on active surface 104, bond wires 108, and substrate bond pads 56 can be viewed in drawing FIG. 8A.

Returning to drawing FIG. 7A, it can be seen that an encapsulant 94 has been disposed in and over aperture 54 to cover die bond pads 106, bond wires 108, and substrate bond pads 56 in order to provide protection against environmental contaminants, corrosives, and incidental physical contact. Applying encapsulant 94 may either be applied before burn-in and testing or can be applied after burn-in and testing as deemed most appropriate.

Solder balls 60 extend a preselected height above encapsulant 94 to ensure that upon the final chip package being installed on the next level of assembly, encapsulant 94 clears the structure in which solder balls 60 are attached. As practiced within the art, solder balls 60 may be formed of a conductive metal such as gold or may be formed of conductive-filled epoxies having suitable and often very specific conductive properties. Alternatively, solder balls can be attached to the terminal end of a particular trace 58, be attached to contact pads provided on substrate 52 in which a respective trace 58 terminates, or be formed of any type of connective element which can serve in connection with or for the same purpose as a solder ball which ultimately provides electrical and mechanical attach points on the next higher level of assembly. Furthermore, it will be appreciated by those in the art that substrate 52 may be provided with a multitude of conductive paths and not just the circuit traces shown in drawing FIG. 5. For example, a given solder ball 60 or solder ball location may be in electrical communication with the opposite surface of substrate 52 by way of through-holes or may be in electrical communication with one more circuit traces that have been sandwiched or laminated within substrate 52 as known and practiced within the art.

At this stage of construction, the exemplary BGA chip package as shown in drawing FIG. 7A is ready for burn-in and testing and is shown as being detached from tape 50. In accordance with the present invention, semi-completed chip package 66 is then placed in a conventional burn-in and test apparatus which includes test tooling 96 as illustrated in drawing FIG. 7B. A semi-completed BGA chip package 66 is then installed in a chip package holder 98 and a moveable probe head 100 is moved into position as shown by the downwardly pointing arrow of drawing FIG. 7B to carefully engage test contact pads 64 located on the periphery of substrate 52 with complimentary positioned probes 102 that are preferably arranged in the same TSOP pin-out configuration as the underlying test contact pads 64. That is, there is a corresponding probe 102 for each test contact pad 64 that, by way of respective circuit traces 62 and 58, leads to a respective substrate bond pad 56, which, in turn, is in electrical communication with a respective die bond pad 106 by way of a bond wire 108, thereby allowing a preselected voltage profile to be applied to initially burn-in attached chip 92. After burn-in, probes 102 preferably remain in contact with its respective test contact pad 64 and tests are conducted to ensure chip 92 is fully operational. Optionally, chip package 66 need not be tested immediately after burn-in but probes 102 and probe head 100 could be withdrawn from chip package 66 and package 66 removed from holder 98 to be reinstalled and tested at a later point in time.

Figure 8A:
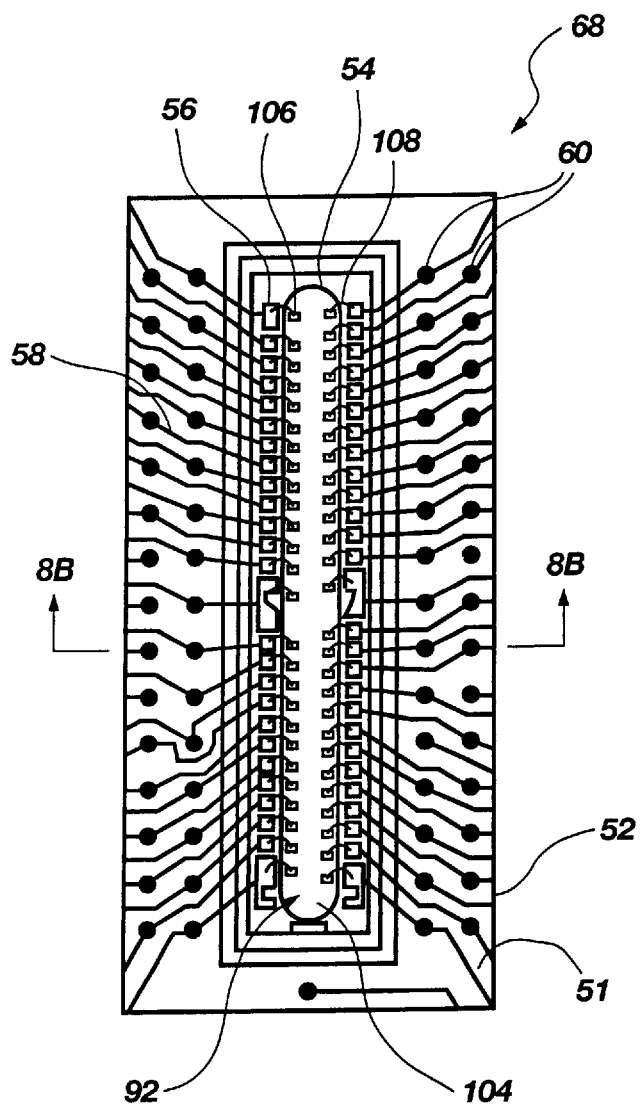
FIG. 8A is a top view of an exemplary 60 ball grid array chip package after burn-in and testing and after having been segmented from a common substrate/tape thereby disassociating the individual chip package from its respective test pads that were arranged in a standard thin small outline package pattern.
Figure 8B:
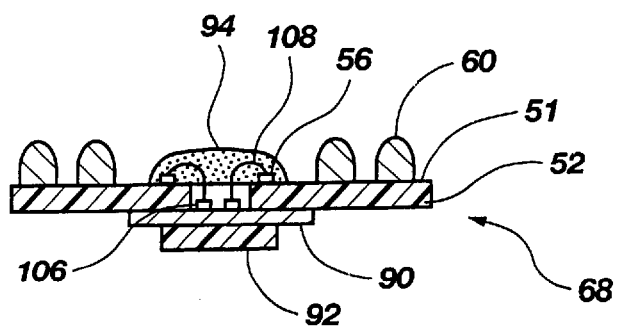
FIG. 8B is a cross-sectional view taken along section line 8B—8B of the 60 ball grid array chip package shown in FIG. 8A and further includes the depiction of encapsulant being disposed over the bond pads located on the active surface of the die, the bond pads located on substrate/tape and the interconnecting bond wires.

Upon a given semi-completed BGA chip package 66 being successfully burned in and tested, the periphery of substrate 52 having test contact pads 64, as well as a large portion of circuit traces 58, can be severed away rendering a completed chip package 68 as shown in drawing FIG. 8A with encapsulant 94 not in place, and as shown in drawing FIG. 8B with encapsulant 94 in place. Completed BGA chip package 68 can either be immediately forwarded for further processing and installation to the next higher assembly or can be placed in storage until ready for installation or shipment at another time.

Figure 9A:
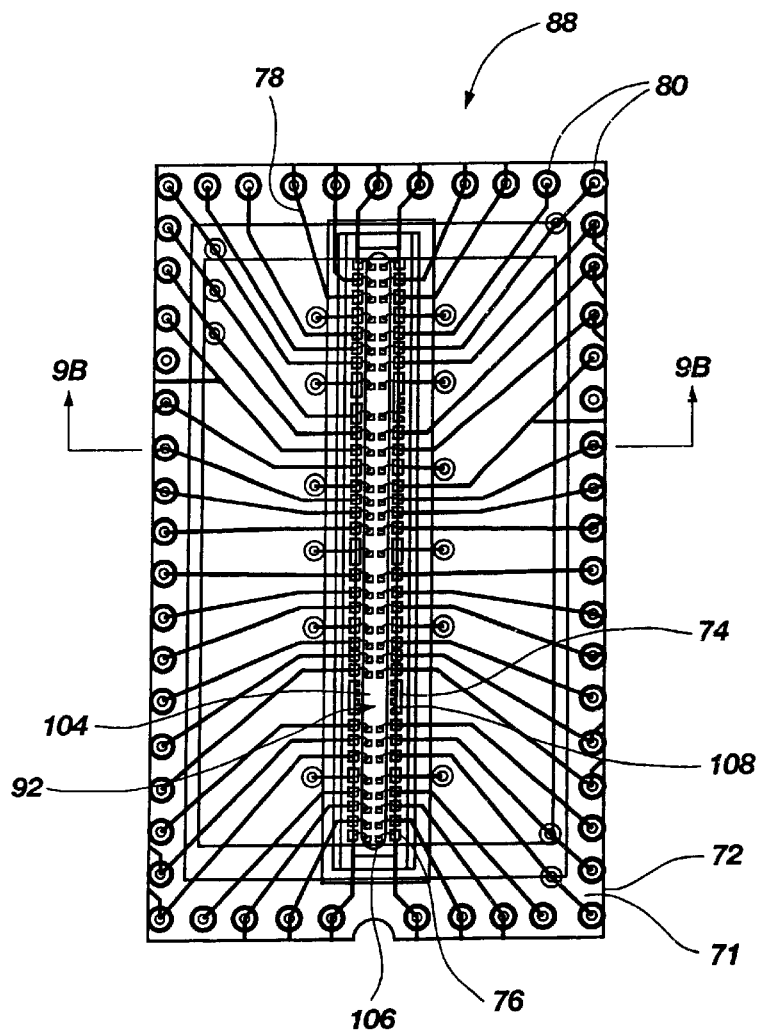
FIG. 9A is a top view of an exemplary 54 ball grid array chip package after burn-in and testing and after having been segmented from a common substrate/tape provided with test pads arranged in a standard thin small outline package.
Figure 9B:
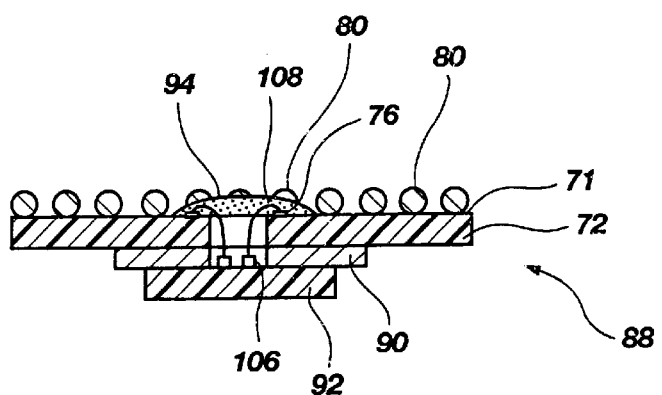
FIG. 9B is a cross-sectional view taken along section line 9B—9B of the 54 ball grid array chip package shown in FIG. 9A and further includes the depiction of encapsulant being disposed over the bond pads located on the active surface of the die, the bond pads located on substrate/tape and the interconnecting bond wires.

The construction, burn-in, and testing process of completed BGA chip package 68 as discussed above is equally applicable to the exemplary completed BGA chip package 88 shown in drawing FIGS. 9A and 9B. Although completed chip packages 68 and 88 have both been shown as being trimmed so as to remove test pads 64 and 84 from respective chip packages 68 and 88, and in the case of chip package 68, with some or most of each circuit trace 58 also having been removed to minimize the surface area or "footprint" of the chip packages, it may not be necessary to do so if the final surface area or "footprint" is not a critical factor. In other words, trimming off peripherally located test pads can be optional if the subject chip package is intended to be installed on a board or other structure where the chip package surface area or footprint is not a factor, thereby saving an unnecessary manufacturing step.

It should also be appreciated that the exemplary BGA chip packages being provided with test pads arranged in a conventional TSOP pin-out pattern allows for the usage of existing test apparatus and test tooling in order to minimize the lead time and associated costs for introducing BGA chip packages. Test pads need not be limited to only a TSOP pattern. For example, a BGA chip package comprising virtually any number of solder balls or other connective elements arranged in any feasible pattern to meet a specified conductive/mechanical attachment pattern, can be provided test pads arranged in other recognized, standard patterns in which conventional, and thus readily available, test apparatus and test tooling can be used. For example, and without limitation, a chip package in accordance with the present invention can alternatively make use of the small outline package (SOP), quad flat pack (QFP), land grid array (LGA) and other patterns in which test tooling is readily available or adaptable for testing chip packages constructed in accordance with the present invention.

Figure 10:
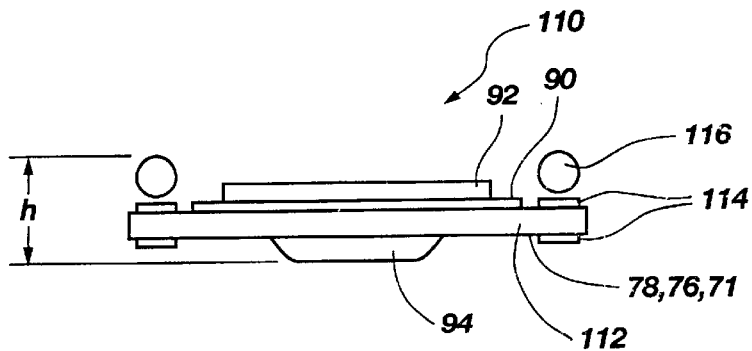
FIG. 10 is a side view of a ball grid array chip package in accordance with the present invention in which a semiconductor die or device is attached to the same side of a substrate on which the solder balls are attached.

Referring now to drawing FIG. 10, illustrated is a side view of an exemplary BGA chip package 110 that is preferably constructed, burned-in, and tested in accordance with the teachings disclosed herein. However, BGA chip package 110 can alternatively be constructed, burned-in, and tested with prior known techniques such as those discussed in relation to drawing FIGS. 1 through 4 herein. As with the exemplary BGA chip packages illustrated within drawing FIGS. 5 through 9B, chip package 110 includes at least one semiconductor die 92 attached to a substrate 112 provided with appropriate electrical traces similar to those provided by way of individual chip portion 71 of tape 70. However, with respect to chip package 1 10, provision must be made to allow for electrical contact to be made through the cross-section of substrate 112 to allow semiconductor chip 92 to be attached to the same surface or face of substrate 112 as are solder balls 116 and solder ball contacts 114. In other words, circuit traces 78 and substrate bond pads 76 are located on what is shown as being the bottom side of substrate 112 in drawing FIG. 10 with circuit traces 78 being placed in electrical communication with the solder ball pads 114 located on the opposite side of substrate 112. As mentioned earlier, providing circuit traces on the exposed faces of substrates or alternatively sandwiched within laminated substrates are known within the art and such can be used to provide electrical communication between solder ball contacts 114 located on the top surface of substrate 112 with bond pads located on the opposite or bottom side of substrate 112.

Furthermore, contacts 114 can be provided on both sides of substrate 112 to allow for stacking of chip packages one on top of the other. Also, as discussed earlier, semiconductor die 92 is attached to substrate 112 by way of any suitable adhesive, a die attach pad or tape 90. An encapsulant 94 is disposed over substrate bond pads, die bond pads, and associated bond wires in the same manner as discussed earlier.

The primary difference between completed BGA chip package 110 and completed BGA package 88 is that the semiconductor die is located on the same side of the substrate as are solder balls 116. Such an arrangement is particularly conducive to decreasing the profile h of the chip package as measured from encapsulant 94 to the far side of solder balls 116 as shown in drawing FIG. 10.

Figure 11:
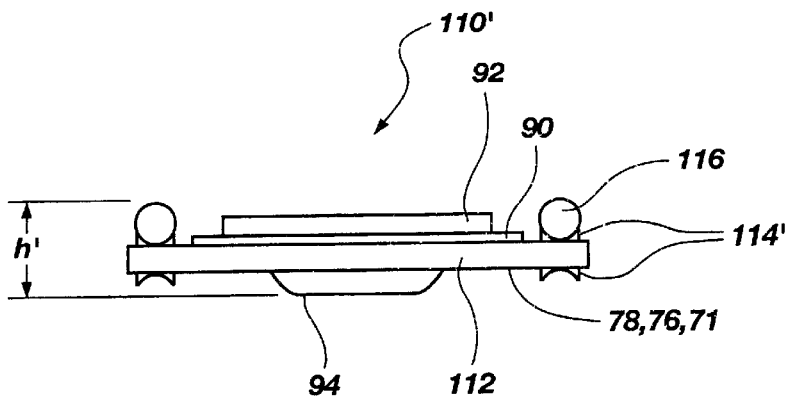
FIG. 11 is a side view of an exemplary ball grid array chip package of the present invention in which a semiconductor die or device is attached to the same side of a substrate on which the solder balls are attached and further in which oppositely positioned ball contact pads are located on both surfaces of the substrate.

Depicted in drawing FIG. 11 is an alternative BGA chip package 110 which is essentially identical to chip package 110 of drawing FIG. 10 with the primary difference between the two chip packages being the provision of concave solder ball contact pads 114 on at least one side and optionally on both sides or surfaces of substrate 112 to allow one chip package to be stacked upon another. By providing a concave or indented surface which accommodates an associated solder ball 116, the profile of the chip package can be reduced to allow an even shorter profile h measured from encapsulant 94 to the far side of solder balls 116 as shown in drawing FIG. 11. By thus reducing the profile of the chip package, a module comprising one or more stacks of such low-profile chip packages can be provided with a total stack height that will allow electronic products incorporating such a low-profile module to be reduced in size. Furthermore, such reduced profile modules having stacks of reduced profile chip packages will allow the art to incorporate modules having less expensive chip packages in products that previously could not accommodate such modules due to space limitations.

Figure 12:
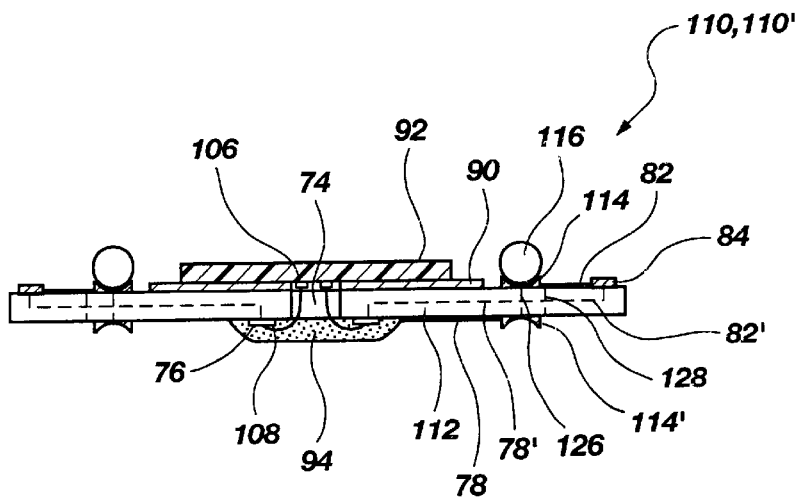
FIG. 12 is a cross-sectional view of the exemplary stackable ball grid array chip package shown in FIG. 11 and depicting circuit traces being optionally positioned within the substrate.
Figure 13:
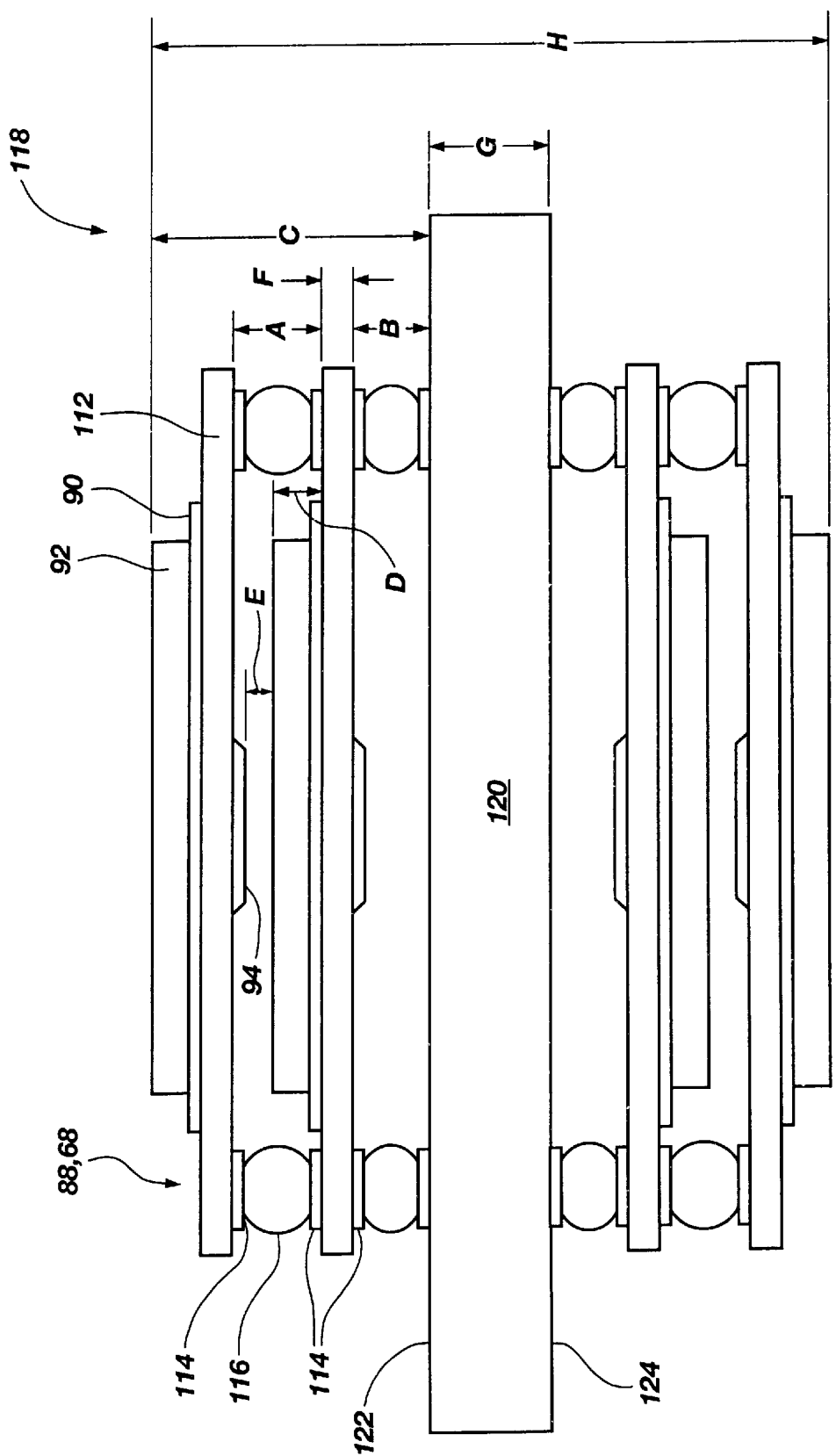
FIG. 13 is a side view of stacked ball grid array chip packages wherein the semiconductor chip or device is located on the opposite side of the substrate on which the solder balls are attached and in which such representative ball grid array chip packages are stacked on opposite sides of a common board to provide a module.

Illustrated in drawing FIG. 12 is a cross-sectional view of an exemplary "upside-down" stackable chip package 110 or 110 as shown in drawing FIGS. 10 and 11. Semiconductor chip or device 92 is positioned on the same side as solder balls 116 with substrate bond pads 76 preferably located on the opposite surface of substrate 112 or as oriented in drawing FIG. 12, the downward facing surface of the substrate. Substrate bond pads 76 are placed in electrical communication with die pads 106 by way of bond wires 108 preferably extending through aperture 74 as shown and are encapsulated by encapsulant 94. Circuit traces 78 may optionally be located on the downward facing surface of substrate 112, by way of ball tape outline 70 and individual die circuit trace 71 for example, and thereby extend outwardly along the downwardly facing surface of substrate 112 whereupon traces 78 may then be routed through the cross-section of substrate 112 or otherwise be placed in electrical connection with optional conductive vias or other conductive elements 126 which extend through substrate 112 to the respectively appropriate pad's connective element or solder ball contact pads 114, or optional concave contact pads 114 located on the opposite or upward facing surface of substrate 112. Optionally, the electrically connecting substrate bond pads 76 with contact pads 114 or 114 as discussed earlier, may be achieved by laminating or "sandwiching" circuit traces 78 within substrate 112 and routing through substrate 112 in order to electrically connect each laminated trace 78 to its respective contact pad 114 or optional pad 114 . The exemplary upside-down BGA chip package illustrated in drawing FIG. 13 is shown prior to the test pads being disassociated from the chip package along substrate severing line 128. As with circuit traces 78, traces 82 which electrically connect contact pads 114 or optional pad 114, may be disposed on the upward facing surface of substrate 112, or optionally may be laminated within substrate 112 as denoted by trace 82 . Upon reaching its respective test pad, trace 82 may then be placed in electrical communication with its respective test pad. Specific methods of extending circuit traces through chip package substrates in order to be placed in electrical communication with contact pads or other connective elements are well known within the art.

Referring to drawing FIG. 13, illustrated is a side view of a representative conventional module, such as a dual in-line memory module (DIMM) 118, wherein BGA chip packages, such as exemplary chip packages 88 and 68 disclosed herein, or alternatively, conventionally constructed chip packages such as representative chip package 10, are installed in a stacked arrangement on opposite faces or surfaces 122 and 124 of a module board 120. Module 118, as illustrated, includes surfaces 122 and 124, each having a stack of two BGA chip packages, one mounted on the other, with the BGA chip package closest to board 120 being secured to board 120. Conventional solder ball contact pads 114 in connection with solder balls 116 provide mechanical and electrical points of attachment and are attached by surface mounting methods widely practiced within the art. Although drawing FIG. 13 shows the use of solder balls 116 and solder ball contact pads 114, it should be understood that other connective elements are known to be used in the art in lieu of solder balls and pads.

As shown in drawing FIG. 13, dimension A is the distance between proximate substrates 112 of stacked chip packages which in effect includes the final height of ball 116 and two contact pads 114. Dimension A conventionally is approximately 0.5 mm or greater. Dimension B, the distance between the closest substrate 112 and board 120, is conventionally approximately 0.5 mm or greater. Dimension C, which is the total stack height of both, or alternatively, all chip packages above board 120 if more than two chip packages are stacked together, is conventionally approximately 1.9 mm or greater.

Dimension D represents the distance the semiconductor die 92 or 16 extends from chip substrate 112 or 12 and typically ranges upward from 0.3 mm. Dimension E is the distance in which encapsulant 94 typically extends from substrate 112 and is approximately 0.15 mm. Chip package substrate 112 has a typical thickness of approximately 0.3 mm. Lastly, board 120, such as those used in dual in-line memory modules, has a dimension G which is typically approximately 1.1 mm.

A conventionally configured memory module such as 118 shown in drawing FIG. 13, consisting of DRAM chip packages for example, has a total overall thickness H ranging between approximately 4.7 mm to approximately 5.1 mm after application of a protective cover over the module necessary to protect the exposed back sides of dies 92 during shipping and subsequent installation in a final product. Such a total thickness of 4.7 to 5.1 mm would thus be unacceptable for use in certain applications, such as in connection with thin profile notebook sized personal computers, as well as other products where volumetric space for memory modules is at a premium.

Figure 14:
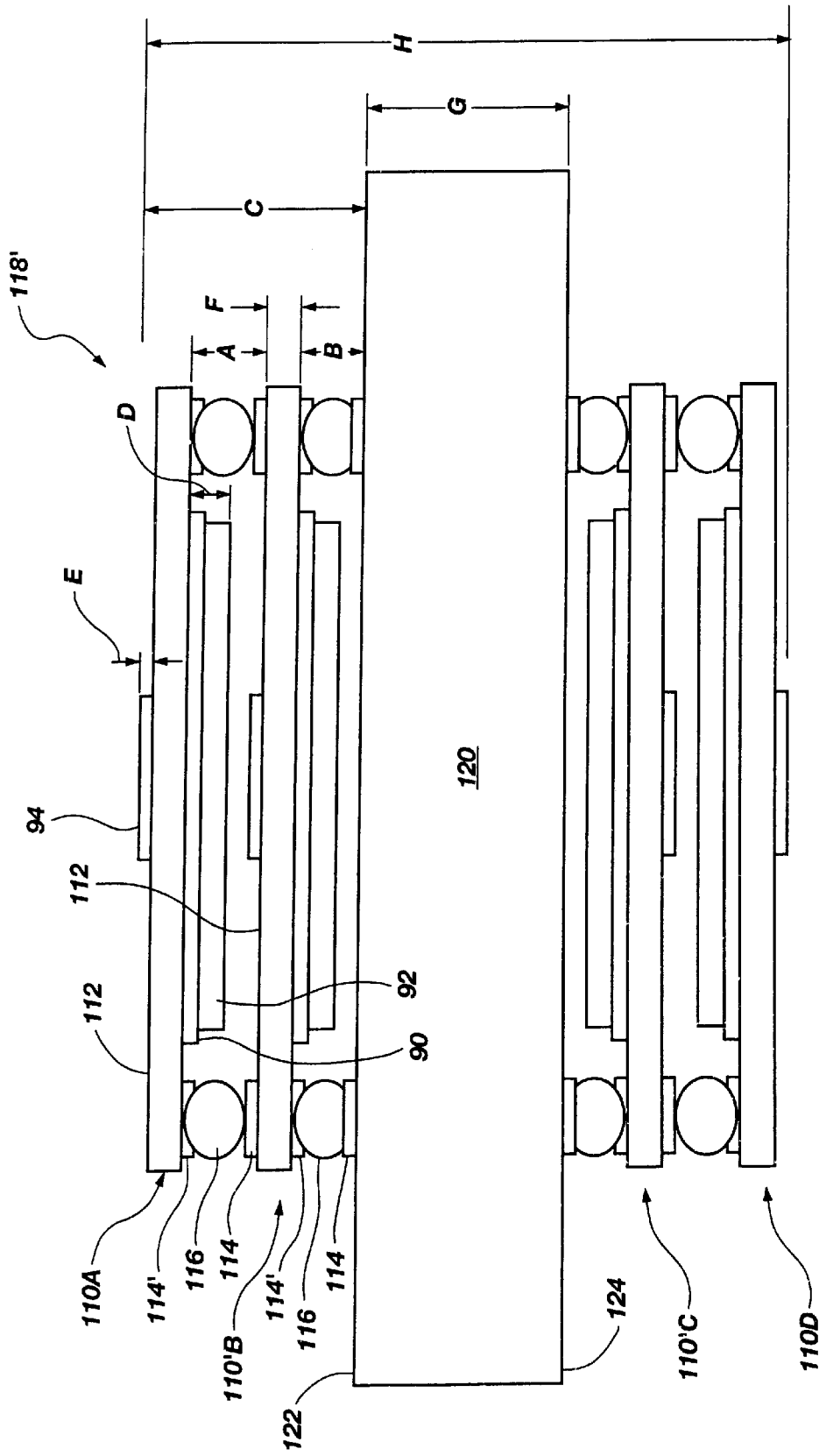
FIG. 14 is a side view of stacked ball grid array chip packages wherein the semiconductor chip or device is located on the same side of the substrate on which the solder balls are attached and in which such ball grid array chip packages are stacked on opposite sides of a common board to provide a module of reduced stack height.

A nonconventionally configured, reduced profile memory module incorporating exemplary BGA chip packages 110 and 110 as illustrated in drawing FIGS. 10 and 11, is shown in FIG. 14 of the drawings. Reduced profile BGA chip packages 110A and 110B, and 110C and 110D, respectively stacked together and mounted on opposite surfaces 122 and 124 of module 118 , are configured to have semiconductor die 92 attached to the same surface of substrate 112 in which solder ball 116, or optional solder ball 116 , and associated concave solder ball contact pad 114 are attached. BGA chip packages constructed in such a nonconventional "upside-down" manner eliminates the need for encasing the module with a protective cover. This is attributable to the backside of each chip 92 being protected by virtue of being physically positioned between either an adjacent chip package within the same stack or between its respective chip substrate 112 and board 120. Thus, the added thickness of a protective cover is eliminated, as well as the associated time and costs of applying such a protective cover.

As discussed with respect to reduced profile or upside-down BGA chip packages 110 and 110 illustrated in drawing FIGS. 10 through 12, such chip packages are preferably constructed, burned-in, and tested in accordance with the earlier described techniques and procedures incorporating severable test contact pads arranged in conventional patterns such as TSOP pin-out patterns. However, modules such as 118 as shown in drawing FIG. 14 can be constructed in an "upside-down" manner, with or without concave solder ball pads 114, while employing prior conventional construction, burn-in, and testing techniques used in producing BGA chip packages such as representative chip package 10.

By incorporating reduced profile, upside-down BGA chip packages, such as chip packages 110A, 110B, 110C, and/or 110D shown in FIG. 14, the total overall thickness H of module 118 can be reduced to approximately 4.4 to 4.6 mm. Dimension A, the distance between proximate substrates 112 of stacked chip packages which, in effect, includes the final height of ball 116 and two contact pads 114, may be maintained at approximately 0.5 mm or optionally can be reduced to approximately 0.4 mm by incorporating concave solder ball pad 114. Dimension B, the distance between the closest substrate 112 and board 120, is maintained at approximately 0.5 mm, but can be reduced to approximately 0.4 mm by use of concave solder ball pad 114 . Dimension C, the total stack height of both, or alternatively all, chip packages above board 120 if more than two chip packages are stacked together, has been substantially reduced to approximately 1.75 mm and may optionally be reduced to approximately 1.65 mm if extensive use of concave solder ball pads 114 are incorporated where possible or eliminated altogether. Dimension D, the distance the semiconductor die 92 extends from chip substrate 112, remains unchanged at approximately 3 mm. Dimension E is the distance in which encapsulant 94 typically extends from substrate 112 or 12 and is approximately 0.15 mm. Chip package substrate 112 thickness F may remain approximately 0.3 mm. However, in certain applications, substrate 112 can be reduced to approximately 0.25 mm if substrate production is very carefully controlled and monitored. Lastly, board 120 thickness dimension G remains approximately 1.1 mm. However, dimension G is capable of being further reduced as is chip package substrate 112 if manufacturing parameters and quality control are adequately addressed providing that board 120 retains the requisite structural rigidity.

Therefore, it can now be appreciated that the exemplary memory module depicted in drawing FIG. 14 incorporates BGA chip packages where the semiconductor die is attached to the same side of the chip package substrate as are the connective elements, such as solder balls 116 and solder ball pads 114, or optional concave solder ball pads 114.

While the exemplary memory module as illustrated in drawing FIG. 14 is shown to incorporate "upside-down"

BGA chip packages which, in turn, incorporate solder balls and associated solder ball contact pads to allow the surface mounting of the chip packages to each other or upon the module board 120 by processes known within the art, it is to be understood that a wide variety of materials and connective structures can be used in lieu of solder balls and/or solder ball contact pads as shown. Furthermore, it should also be understood that depending on the particular type of circuitry provided on or within chip package substrates 112 as well as on or within module board 120, it is possible to eliminate the use of solder ball contact pads entirely and instead place a respective connective element, such as solder balls 116, in direct electrical communication with the appropriate circuitry or element that is serving the same function as a solder ball contact pad.

Figure 15:
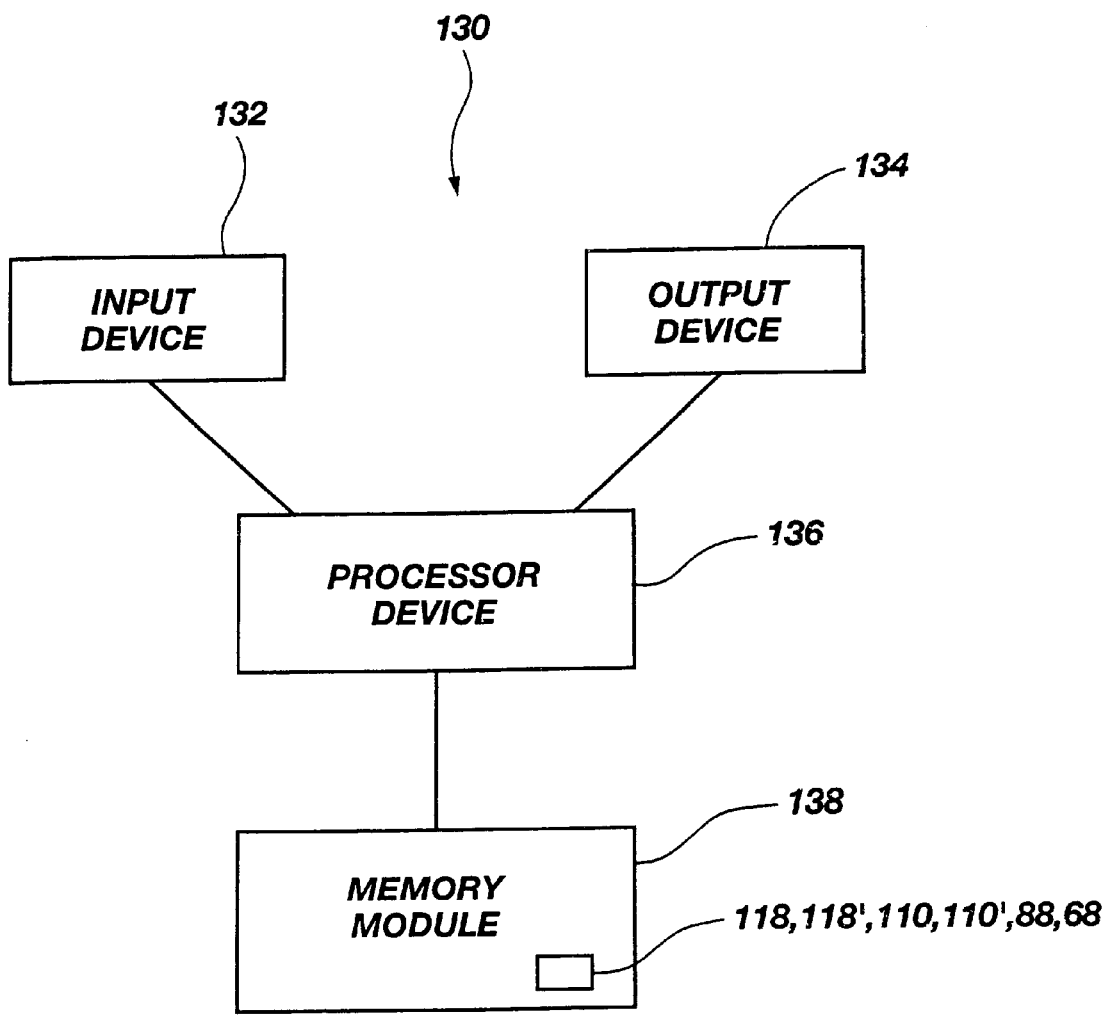
FIG. 15 is a schematic diagram of an electronic system incorporating a memory module of one or more ball grid array packages embodying the present invention.

Referring now to drawing FIG. 15, a schematic of an electronic system 130, such as, but not limited to, a notebook sized personal computer, including an input device 132 and an output device 134 coupled or otherwise in electrical communication with a processor device 136, is illustrated. Processor device 136 is also coupled or otherwise in electrical communication with a memory device 138 incorporating stackable chip packages such as 68, 88, 110, 110 or embodiments and variations thereof, as well as modules or embodiments and variations thereof, incorporating stacks of chip packages embodying the teachings disclosed within the specification and drawings. Furthermore, processor device 136 may be directly embodied in a module embodying the teachings hereof and include, without limitation, a microprocessor, a first level cache memory, and additional integrated circuits, such as a video processor, an audio processor, or a memory management processor.

Having thus described and illustrated exemplary chip packages and modules embodying the invention, it will be understood that a multitude of changes, adaptations, revisions, additions, and deletions may be made to the invention without departing from the scope of the invention. Furthermore, such may be required by the design of the semiconductor device and its attachment to the chip package substrate and/or the design of the chip package and its attachment to other chip packages, modules, accommodating assemblies, or adjacent assemblies of semiconductor devices.

What is claimed is:

1. A memory module assembly comprising:
    a module board having a first surface and a second surface including, the module board having at least one electrical circuit to be placed in electrical contact with at least one ball grid array semiconductor package;
    at least one of the first and the second surfaces of the module board comprising:
        at least one first ball grid array semiconductor package attached to the at least one of the first and the second surfaces of the module board by a plurality of mutually complementary connective elements in electrical communication with the at least one electrical circuit of the module board, the at least one first ball grid array semiconductor package comprising:
            a substrate having a first surface, a second surface, and an aperture extending from the first surface through the substrate to the second surface, a plurality of substrate bond pads located on the first surface proximate to the aperture;
            the plurality of connective elements in electrical communication with the module board being attached to and extending from the second surface of the substrate being arranged in a preselected grid array pattern having at least one preselected pitch dimension between adjacent connective elements;
        a semiconductor device having an active surface and a plurality of bond pads thereon, the semiconductor device attached to the second surface of the substrate and positioned adjacent the module board;
        a plurality of bond wires extending through the aperture, each of the plurality of bond wires connecting one of the plurality of bond pads on the active surface of the semiconductor device with one of the plurality of substrate bond pads on the first surface of the substrate; and
        the substrate including a plurality of mutually discrete electrically conductive circuit traces, each circuit trace of the plurality of circuit traces selectively extending from one of the plurality of substrate bond pads to one of the plurality of connective elements.

2. The memory module assembly of claim 1, further comprising:
    at least one second ball grid array semiconductor package having a substrate having at least one electrical circuit;
    the at least one second ball grid array semiconductor package stacked onto and mechanically and electrically attached to the at least one first ball grid array semiconductor package by a second plurality of mutually complementary connective elements extending from the first surface of the substrate of the at least one first ball grid array semiconductor package to the substrate of the at least one second ball grid array semiconductor package; and
    the second plurality of mutually complementary connective elements being arranged in a preselected grid array pattern and at least one of the second plurality of connective elements being in contact with the at least one electrical circuit of the substrate of the at least one second ball grid array semiconductor package.

3. The memory module assembly of claim 2, further comprising:
    at least one additional first ball grid array semiconductor package attached to the remaining opposite surface of the module board in which the at least one first ball grid array semiconductor package is attached;
    the at least one additional first ball grid array semiconductor package mechanically and electrically attached to the opposite surface of the module board by a third plurality of mutually complementary connective elements extending between the opposite surface of the module board and the substrate of the at least one additional first ball grid array semiconductor package; and
    the third plurality of connective elements being in electrical communication with the at least one electrical circuit of the module board.

4. The memory module assembly of claim 3, further comprising:
    at least one additional second ball grid array semiconductor package having a substrate having at least one electrical circuit;
    the at least one additional second ball grid array semiconductor package stacked onto and mechanically and electrically attached to the at least one additional first ball grid array semiconductor package by a fourth plurality of mutually complementary connective elements extending from the first surface of the substrate of the at least one additional first ball grid array semiconductor package to the substrate of the at least one additional second ball grid array semiconductor package; and the fourth plurality of mutually complementary connective elements being arranged in a preselected grid array pattern and at least one of the fourth plurality of connective elements being in contact with the at least one electrical circuit of the substrate of the at least one additional second ball grid array semiconductor package.

5. The memory module assembly of claim 4, wherein at least one of the pluralities of mutually complementary connective elements comprises a solder ball.

6. The memory module assembly of claim 5, wherein at least one of the pluralities of mutually complementary connective elements further comprises a solder ball contact pad.

7. The memory module assembly of claim 6, wherein at least one of the pluralities of mutually complementary connective elements further comprises two solder ball contact pads, each of said solder ball contact pads accommodating the solder ball therebetween.

8. The memory module assembly of claim 7, wherein at least one of the solder ball contact pads comprises a concave-shaped surface for accommodating the solder ball.

9. A method of constructing a memory module comprising:

providing a module board having a first surface and a second surface, the module board having at least one electrical circuit adapted to accommodate connective elements of at least one ball grid array semiconductor package;

providing at least one first ball grid array semiconductor package having a substrate of a preselected cross-sectional thickness having a first surface, a second surface, and an aperture extending from the first surface through the substrate to the second surface, a plurality of substrate bond pads located on the first surface proximate to the aperture;

providing a plurality of contact elements located on the second surface of the substrate, each of the plurality of contact elements extending an approximate preselected distance from the second surface and being arranged in a preselected grid array pattern having at least one preselected pitch dimension between adjacent contact elements of the plurality of contact elements;

providing a semiconductor device having an active surface and a plurality of bond pads thereon, the semiconductor device attached to the second surface of the substrate, the semiconductor device extending a preselected distance from the second surface of the substrate;

providing a plurality of bond wires extending through the aperture, each of the plurality of bond wires connecting one of the plurality of bond pads on the active surface of the semiconductor device with one of the plurality of substrate bond pads on the first surface of the substrate;

providing the substrate with a plurality of mutually discrete electrically conductive circuit traces, each circuit trace of the plurality of circuit traces selectively extending from one of the plurality of substrate bond pads to one of the plurality of contact elements;

positioning the at least one first ball grid array semiconductor package proximately adjacent to at least one of the first and the second surfaces of the module board; and attaching the connective elements of the at least one ball grid array semiconductor package to the module board and placing the connective elements in electrical communication with the at least one electrical circuit of the module board.

10. The method of constructing the memory module of claim 9, wherein providing the plurality of contact elements of the at least one first ball grid array semiconductor package comprises a contact pad and a solder ball and the attaching and the placing of the connective elements comprises mechanically and electrically attaching the solder ball of each connective element to a respective contact pad provided on at least one of the first and the second surfaces of the module board.

11. The method of constructing the memory module of claim 9, further comprising providing the at least one first ball grid array semiconductor package with a plurality of contact pads on the first surface of the substrate arranged in a preselected pattern to accommodate a second ball grid array semiconductor package.

12. The method of constructing the memory module of claim 11, further comprising:

providing the second ball grid array semiconductor package comprising a substrate having connective elements on a surface thereof arranged in a pattern complementary to the plurality of contact pads of the first surface of the substrate of the at least one first ball grid array semiconductor package; and mechanically and electrically attaching the connective elements of the second ball grid array semiconductor package to the respective plurality of contact pads provided on the first surface of the at least one first ball grid array semiconductor package.

13. The method of constructing the memory module of claim 12, wherein providing the second ball grid array semiconductor package comprises attaching a second semiconductor device to the same surface of the substrate of the second ball grid array semiconductor package as the connective elements of the second ball grid array semiconductor package.

14. The method of constructing the memory module of claim 13, wherein providing the second ball grid array semiconductor package comprises providing at least one of the connective elements with a contact pad having a concave surface accommodating a solder ball.

15. The method of constructing the memory module of claim 13, further comprising:

providing and electrically and mechanically attaching to the remaining surface of the module board at least one third ball grid array semiconductor package by way of a plurality of connective elements extending from a surface of a substrate of the at least one third ball grid array semiconductor package; and providing and electrically and mechanically attaching a fourth ball grid array semiconductor package to the at least one third ball grid array semiconductor package by way of a plurality of connective elements extending from a surface of a substrate of the fourth ball grid array semiconductor package.

16. The method of constructing the memory module of claim 15, wherein providing and electrically and mechanically attaching the at least one third and the fourth ball grid array semiconductor packages further comprises providing at least one of the plurality of connective elements of the at least one third and the fourth ball grid array semiconductor packages with at least one contact pad accommodating a solder ball.

17. The method of constructing the memory module of claim 16, wherein providing at least one of the plurality of connective elements of the at least one third and fourth ball grid array semiconductor packages further comprises providing the at least one contact pad with a concave surface for accommodating the solder ball.

18. The method of constructing the memory module of claim 15, wherein providing and electrically and mechanically attaching the at least one third ball grid array semiconductor package comprises attaching a semiconductor device to the same surface of the substrate as the plurality of connective elements extend from the at least one third ball grid array semiconductor package to the remaining surface of the module board.

19. The method of constructing the memory module of claim 15, wherein providing and electrically and mechanically attaching the fourth ball grid array semiconductor package comprises attaching a semiconductor device to the same surface of the substrate as the plurality of connective elements extend from the fourth ball grid array semiconductor package to the at least one third ball grid array semiconductor package.

20. The method of constructing the memory module of claim 9, wherein providing the at least one first ball grid array semiconductor package further comprises: burning-in and testing the semiconductor device of the at least one ball grid array semiconductor package prior to attaching the connective elements of the at least one first ball grid array semiconductor package to the module board by electrically contacting at least one of a plurality of test pads provided on the substrate of the at least one first ball grid array semiconductor package.

21. The method of constructing the memory module of claim 20, wherein burning-in and the testing of the semiconductor device of the at least one ball grid array semiconductor package further comprises disassociating the plurality of test pads provided on the substrate of the at least one first ball grid array semiconductor package prior to attaching the connective elements of the at least one first ball grid array semiconductor package to the module board.

22. The method of constructing the memory module of claim 15, wherein providing the at least one first, the second, the at least one third, and the fourth ball grid array semiconductor packages further comprises:

burning-in and testing the semiconductor device of the at least one of the provided ball grid array semiconductor packages by electrically contacting at least one of a plurality of test pads provided and arranged in a preselected pattern on the substrate of the at least one provided ball grid array semiconductor packages prior to attaching the at least one of the provided semiconductor packages to the module board or to one of the other ball grid array semiconductor packages.

23. The method of constructing the memory module of claim 22, wherein burning-in and testing the semiconductor device of the at least one of the provided ball grid array semiconductor packages by electrically contacting the at least one of the plurality of test pads provided on the substrate of the at least one provided ball grid array semiconductor packages further comprises disassociating the plurality of test pads from the substrate of the at least one of the provided ball grid array semiconductor packages prior to attaching the at least one of the provided semiconductor packages to the module board or to one of the other ball grid array semiconductor packages.

24. The method of constructing the memory module of claim 22, wherein burning-in and testing the semiconductor device of the at least one of the provided ball grid array semiconductor packages further comprises arranging the plurality of test pads to correspond to a thin small outline package pin-out pattern.

* * * * *